United States Patent [19]

Cung

[11] Patent Number: 4,706,264

[45] Date of Patent: Nov. 10, 1987

[54] DIGITAL DATA COMPRESSION METHOD AND MEANS

[75] Inventor: David Cung, Palo Alto, Calif.

[73] Assignee: Chung Telecommunications, Palo Alto, Calif.

[21] Appl. No.: 506,603

[22] Filed: Jun. 22, 1983

[51] Int. Cl.$^4$ .............................................. H04B 1/66
[52] U.S. Cl. ................................. 375/122; 358/263; 382/56
[58] Field of Search .................. 381/29, 30, 31, 32; 358/263; 382/56; 375/122

[56] References Cited

U.S. PATENT DOCUMENTS

| | | | |
|---|---|---|---|
| 4,091,424 | 5/1978 | Widergren | 358/263 |
| 4,410,916 | 10/1983 | Pratt et al. | 358/263 |
| 4,494,150 | 1/1985 | Brickman et al. | 358/263 |

FOREIGN PATENT DOCUMENTS 2105553  3/1983  United Kingdom ............... 375/122

*Primary Examiner*—Joseph A. Orsino, Jr.
*Attorney, Agent, or Firm*—Cesari and McKenna

[57] ABSTRACT

A system for compressing digital data maintains a code table of plaintext symbols at a transmitting location. Blocks of plaintext symbols in a message are encoded using the code table which table is updated using an update algorithm. The codes for those blocks are transmitted to a receiving location where a second code table is maintained. At the receiving location, the transmitted symbols are decoded using that second code table. That code table is also updated by applying to the plaintext symbols recovered during the decoding process the same update algorithm used at the transmitting location so that the two code tables are the same at any given point in the transmission.

10 Claims, 3 Drawing Figures

DIGITAL DATA COMPRESSION METHOD AND MEANS

This invention relates to method and means for compressing a digital message or data stream for transmission to a receiving location. At that location, the transmission is restored to its uncompressed state to recover the original message or data stream.

BACKGROUND OF THE INVENTION

The use of digital data compression techniques to minimize transmission time has received considerable attention in recent years due to rapidly increasing communications of digital data and the concomitant increase in the importance of line charges. Obviously, if a given amount of intelligence can be transmitted in less time, there will be a commensurate reduction in line costs.

There are various known techniques for achieving the compression of data. One technique is analog curve fitting wherein a signal sequence is represented by a curve or waveform and the coefficients of a polynomial expression fitted to curve are transmitted. At the receiving location, the curve is reconstructed from those coefficients. However, this compression technique is subject to error resulting from the inability, in general, to provide an exact curve fit to a waveform. It is, therefore, unsuitable for transmission of a digital data stream where absolute accuracy is required. For example, transmission of text or financial data must usually be free from error.

In another technique, known as Huffman coding, blocks of characters are encoded according to their frequencies of occurrence. In long messages, this technique can provide highly efficient codes. However, with short to medium length messages, the codes must be changed from time to time to reflect changes in frequencies of occurrence. Whenever such a change is made, coding instructions must be transmitted to the receiving location to enable the receiver to decode the transmitted messages. Obviously, the requirement to transmit these instructions reduces the savings in transmission time gained by the coding of the message information.

OBJECTS OF THE INVENTION

Accordingly, the present invention aims to provide an improved method and means for efficiently encoding digital data for transmission to a receiver capable of recovering the original data without error.

Another object of the invention is to provide a system such as this which does not require the transmission of special coding information to the receiver to enable it to retrieve the original message from the transmitted data.

Still another object of the invention is to provide a system of this type which is not overly complicated or expensive to make or maintain.

Other objects will, in part, be obvious and will, in part, appear hereinafter.

The invention accordingly comprises the several steps and the relation of one or more of such steps with respect to each of the others, and the apparatus embodying the features of construction, combination of elements and arrangement of parts which are adapted to effect such steps, all as exemplified in the following detailed description, and the scope of the invention will be indicated in the claims.

SUMMARY OF THE INVENTION

Briefly, in the present system, the data to be transmitted is obtained from a conventional data source such as a keyboard, computer, telemetry receiver, etc. Although the compression technique can be applied to any stream of digital data, for purposes of discussion, we will assume that the data stream is an English language message using various alphanumeric, punctuation and other symbols, such as those represented by the conventional ASCII 7-bit code. For the purposes of this description, we shall use the term "plaintext" in referring to symbols represented by a conventional code such as the ASCII code. The terms "code" and "encoded" refer to codes developed by the system.

At the transmitting location, codes are applied to blocks of characters, the encoding algorithm taking into account the frequencies of occurrence of the various blocks. This is a continuing process, with the overall code thus changing adaptively according to the strings of plaintext symbols received at the transmitting location from the source of these symbols.

The initial code is conveyed to the receiving location by any suitable means. Then, during reception of the message, the receiver updates its stored code table adaptively by applying to the plaintext symbols recovered from the decoding process the same codechanging algorithm that is used at the transmitting location. With an updated code, the receiver can thus continuously decode the coded symbols received from the transmitting location without requiring the separate transmission of update information.

With this arrangement, I have obtained a 2:1 reduction in the number of bits required to transmit a message. Moreover, this reduction has been obtained with an encoding version applied only to blocks of two characters.

More specifically, in the preferred coding algorithm, the code table is stored in matrix form in a random access memory. Each symbol in the symbol set subject to coding defines a unique set of addresses in this code memory. For example, each character in the ASCII set discussed above may be used as the address of a row in the memory, i.e. defining the set of memory addresses in that row. The memory also has numbered column addresses. Thus, by applying selected row and column addresses to the memory, a unique memory location is defined.

Characters in the message to be transmitted are used to address the corresponding row in the memory, and the system then cycles through the column addresses to determine if a block of characters, following the addressing character in the text, are stored in a location in that row in the memory. For ease of explanation at this point, we will assume that the system scans for the next two characters following the addressing character to see if they are present in a location in that row.

If that following block of two characters is not found, then it is loaded into an available memory location in the addressed memory row and the second character is released for transmission in plaintext. Just prior to transmission, the seven-bit plaintext representation for the character is concatenated with an eighth bit, e.g. a ZERO, that serves as a status bit identifying the bits transmitted as plaintext.

On the other hand, if that pair of characters is found in a location in the addressed memory row, the memory column number corresponding to that location is transmitted as a code word for the block. In that case, the concatenated status bit is a ONE, identifying the word as a code for a pair of characters. Thus, the single column number that is transmitted represents two characters of the message, resulting in a saving of one character in the data that is actually transmitted.

At the receiving location, there is a code memory that has exactly the same contents as the code memory at the transmitting location. Accordingly, when a column number is received, the receiving unit addresses its memory with the received column number and the row address provided by the preceding character. In this manner, the receiving unit retrieves from its memory the plaintext versions of the two characters encoded by means of the column number.

If the second character was transmitted in plaintext, the transmitting unit searches the corresponding row in its code memory for a location containing the third and fourth characters of the message. If it finds such a location, it transmits the corresponding column number, as described above. The receiving unit decodes the column number, as described, by retrieving the third and fourth characters from its code memory.

If the second and third characters were transmitted in code, the transmitting unit skips to the third character and searches the corresponding row of its memory for the fourth and fifth characters. Depending on whether or not these characters are found in a location in that row, it then transmits either (a) the code (column number) for the fourth and fifth characters or (b) the fourth character in plaintext. The receiving unit responds accordingly as described above.

The algorithm that controls the transmission of data is thus as follows:

(1) If a character is transmitted in plaintext, the next block of characters is sent in code (i.e., column number) if the block is found in a code memory location in the row defined by that character. Otherwise, the next character is sent in plaintext.

(2) If a character is the last character in a block transmitted in code, the procedure of (1) above is followed, i.e. the next block is transmitted in code if it is found in a location in the memory row defined by that character. Otherwise, the next character is sent in plaintext.

(3) If a character is in a block transmitted in code, but is not the last character in the block, no action is taken.

The memories at the transmitting and receiving locations may be updated according to any of a number of algorithms. A simple algorithm that can be used is based on the fact that, if a character is transmitted in plaintext, the code memory was not found to contain the text block beginning with that character, in the row of locations defined by the preceding character. Accordingly, whenever a plaintext character is transmitted, the code memory is updated by storing the block that begins with that character in the next available location in the row defined by the preceding text character. The memory is not updated at other times.

The "next available" location in each memory row may be determined simply by selecting the location whose contents have been stored the longest. That criterion can be met by simply selecting each location in order, in other words, cycling through the column numbers one by one.

Alternatively, the system may maintain statistics for each row, keeping track of the frequency with which a block of characters has been found in each of the locations in that row. The "next available" location in that row is then the location having the lowest frequency of such matches.

In either case, the coding of character sets will be adaptive, following the frequencies of various blocks of characters in the text, the latter algorithm following frequency more closely, though with some increase in system complexity.

Moreover, both the transmitting and receiving locations can readily follow the same adaptive algorithm; that is the receiving unit can update its code table without special transmissions for that purpose.

Actually, as alluded to previously, an actual embodiment of the present system encodes blocks of five message characters since greater message compression results from encoding larger blocks. Also, as will be described later, provision is made for encoding partial matches to the five characters stored in the various memory locations to achieve even further compression of the message being transmitted.

At the transmitting station, updating of the code memory is delayed until after the transmission of a number of characters equal to the number in a block. This provides the required synchronization of updating at the transmitting and receiving stations. Specifically, this delay enables the system to update the code at the same point in the data stream at both the transmitting and receiving stations. It thus ensures that the receiving station is not faced with the impossible task of interpreting a code word that is received before the code memory at that station has been updated to contain the latest assignment of that code word.

Due to the adaptive nature of the encoding system, it takes a certain amount of time to build up the tables in the code memories. Consequently, there is relatively little compression at the beginning of a message. As the message continues, however, the amount of compression increases. To avoid the necessity of building up the contents of the memories from scratch, the code memories at the transmitting and receiving locations can be preloaded with identical blocks reflecting some a priori knowledge of frequency occurrence. This will provide at least some message compression from the beginning of the transmission.

Indeed, the preloading of the code memories provides a convenient means for scrambling a transmission so that, if it should be intercepted, it would not be intelligible to a listener who does not have the preloaded code table.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENT

Figure 1:
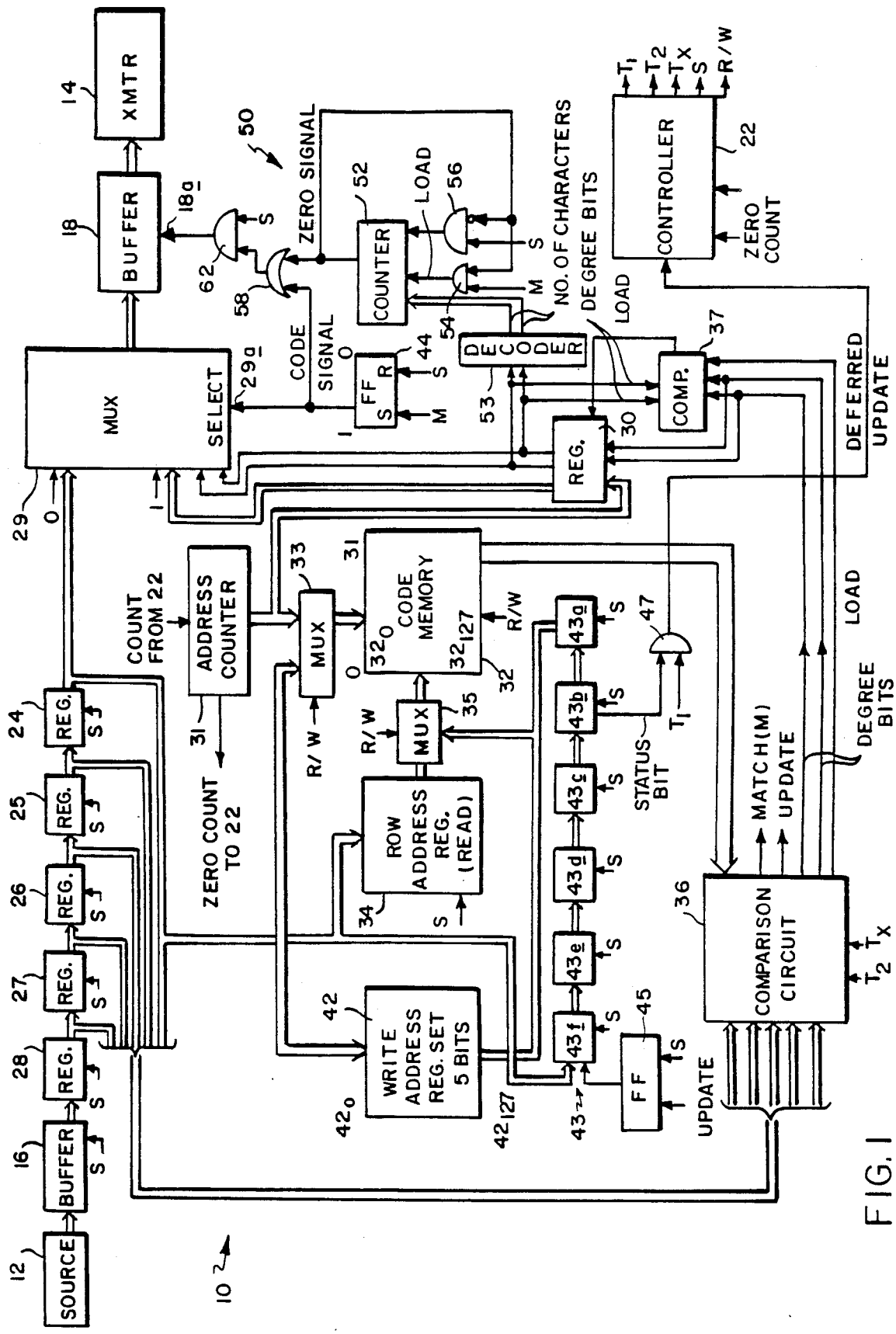
FIG. 1 is a diagrammatic view of the transmitting section of the present system.

Referring now to FIG. 1 of the drawings, the encoding section of the present system, indicated generally at 10, processes a digital data stream from a source 12 prior to its transmission by transmitting means 14 to a receiving site. Source 12 may be a keyboard, a computer or other processing means. The transmitting means 14 may be a modem or other conventional means for sending the output from the receiving section 10 to a receiving site over a suitable communications link. Preferably, section 10 is isolated from the source 12 and transmitting means 14 by buffer memories 16 and 18 so that it can run independently on its own internal controller 22 which issues appropriate control and timing signals to other elements in the encoding section. Some of these signals are explicitly depicted in the drawings, others are implicit in operation of the system as will be apparent to those skilled in the art. The controller functions in response to its own interval time, as well as to the status of various signals in the system, so that the whole functions as a single machine. Furthermore, while the relative times of various signals will be maintained in accordance with the algorithms described herein, their absolute timings may vary. For example, when a block of characters is transmitted by a code word representation, the S signals described herein will be speeded up in order to speed up the replacement of the block by the shifting in of more plaintext characters from the buffer 16.

The encoding section 10 encodes blocks of characters in accordance with a code table contained in matrix form in a random access code memory 32. In the encoding section, the successive message characters from buffer 16 are shifted through a series of five registers 28 to 24 by SHIFT (S) pulses from the controller 22. The character in the right-hand register 24 is applied to one channel or set of terminals of a multiplexer 29. The multiplexer receives at its other channel the contents of a register 30. The output of the multiplexer is applied to buffer 18. Multiplexer 29 passes the data applied to it from register 24 unless a CODE signal is applied to its select terminal 29a, in which case it passes a code word contained in register 30.

An address counter 31 provides column addresses for the code memory 32 by way of a multiplexer 33. The row addresses for the memory are received through a multiplexer 35 from a row address register 34 which contains the last character shifted out of the right-hand register 24.

Between pulses S, an encode routine is initiated by the read condition of a READ/WRITE (R/W) signal applied by controller 22 to memory 32 and multiplexers 33 and 35. The controller also provides in this routine, the message character in row address register 34 which is used as a row address for locations in memory 32. Further, counter 31 cycles through the memory column addresses so that the system can scan the locations in the addressed memory row to determine if there is a match or partial match between the combined contents of registers 24 to 28 and a block of characters contained in one of those memory locations.

In this example, the message characters processed by section 10 are each represented by seven bits which identify the particular characters. Accordingly, memory 32 has 128 addressable rows $32_0$ to $32_{127}$ corresponding to characters $C_0$ to $C_{127}$. The columns of memory 32 are identified by five-bit column numbers from counter 31 so thus the counter has a recycling count of 0 to 31 and the memory has 32 addressable columns. Since the present system tries to match up to five of the characters in registers 24 to 28 with the contents of memory locations, the memory 32 is five characters deep, i.e. each location stores a block of five characters.

The code word contained in the register 30 consists of (a) five bits designating the number of the memory column, if any, containing a block of characters matching the contents of the registers 24 to 28 and (b) two bits indicating the extent or degree of the match. That is 00=first two characters (in registers 24 and 25) match the corresponding characters in the memory location; 01=first three characters match; 10=first four characters match; and 11=all five characters in registers 24 to 28 match.

During the encode routine, a comparison circuit 36 detects a match of two or more characters, beginning with the characters in registers 24 and 25, with the block of characters in each of the thirty-two locations in the memory row scanned by the cycling of counter 31. When it detects such a match, comparison circuit 36 produces two degree bits on two output lines which indicate the extent or degree of the match between the contents of registers 24 to 28 and the "found" character block in memory. The degree bits are compared by a comparator 37 with the corresponding bits in register 30, which was cleared prior to the beginning of the encode routine. If the degree of the match exceeds the number represented by the degree bits in the register 30 (as will always be the case for the first match encountered during an encode routine), the comparator 37 gates to register 30 a LOAD (L) pulse emitted by comparison circuit 36 in response to a $T_x$ pulse from controller 22 shortly after the circuit 36 makes the degree bits available. In response to the L pulse, the register 30 loads the contents of address counter 31 and the degree bits from circuit 36.

Accordingly, as counter 31 scans along the addressed memory row, if a match or partial match occurs of a greater degree than a previous match recorded in register 30, i.e. more characters match than in the previously recorded match, this is detected by comparator 37. The comparator thereupon issues a LOAD pulse to register 30 to record the code relating to the new match. Thus, after counter 31 has scanned through the thirty-two locations in the addressed memory row, register 30 contains a code derived from the "best" match found in that row. If any match was obtained during the encode routine, the circuit 36 then issues a MATCH (M) pulse.

Still referring to FIG. 1, the MATCH (M) signal issued by circuit 36 after counter 31 has scanned the addressed memory row is applied to the SET input of a flip-flop 44 which is reset by the next SHIFT pulses. The setting of the flip-flop applies a signal to multiplexer terminal 29a causing the multiplexer to select the code in register 30 rather than the character in register 24. The multiplexer 29 tags the code with an additional ONE status bit identifying the data word sent from the multiplexer as a code rather than a plaintext character.

If comparison circuit 36 detected no match or a match of only the one character in register 24, it issues no M pulse to set flip-flop 44. Consequently, multiplexer 29 passes the character of register 24 and tags it with a ZERO status bit identifying it as a plaintext character.

The data passed by multiplexer 29 is loaded into the buffer 18 only upon receipt of an S pulse at the buffer's control terminal 18a. This pulse is passed by a logic circuit indicated generally at 50 which applies the transmission algorithm discussed above.

Specifically, circuit 50 comprises a counter 52 which is loaded with a character number from a decoder 53 which receives the two degree bits, contained in register 30, reflecting the degree of match. That number is loaded into the counter upon the coincidence of a ZERO pulse and an M pulse at an AND circuit 54 which issues a LOAD signal to the counter. That is, if there is a five-character match, a five count is loaded into the counter; if there is a four character match, a four count is placed in the counter, and so on down to a two count. Counter 52 counts SHIFT pulses passed by an AND circuit 56. The counter counts down to zero, at which point a decoding circuit in the counter emits a ZERO signal. This signal, which disables AND circuit 56, thereby stops the count.

The ZERO signal from counter 52 is also applied as an enabling signal to AND circuit 54 as noted above and to an OR circuit 58 which also receives the ONE output from flip-flop 44. The signal from the OR circuit enables a gate 62 to pass pulses S to the buffer control terminal 18a.

The counter 52 "idles" in its zero state. Thus, when the multiplexer 29 is conditioned to pass a plaintext character from register 24, the ZERO signal from the counter 52 enables the gate 62 to pass the next S pulse to the buffer 18. On the other hand, if a match has been found in the code memory 32, so that a code is to be transmitted, the ZERO signal enables gate 54 so that the M pulse loads the character number from decoder 53 into counter 52. The ZERO signal from counter 52 thus drops and the counter begins to count S pulses passed by the now-enabled gate 56. At the same time, the M pulse has set the flip-flop 44 whose output enables the gate 62 to pass the next S pulse. In response to that S pulse, the buffer 18 loads the code from register 30 passed by multiplexer 29.

That same S pulse resets flip-flop 44, thereby disabling the gate 62. The buffer 18 therefore does not respond to the next S pulse and thus does not accept the character in the register 24. This inhibiting action continues, with successive characters being loaded into register 30 but not being loaded into buffer 18, until the counter 52 reaches ZERO. The signal from the counter then enables the buffer 18 to load the next word (plaintext character or code word) passed by multiplexer 29. Thus, after allowing the buffer 18 to accept the code word contained in the register 30, the logic circuit 50 has prevented the buffer from accepting any of the plaintext characters represented by that code word.

While the counter 52 counts down toward ZERO, its output signal inhibits AND circuit 54. Thus, its count is affected by any match of a block of characters in memory 32 detected by circuit 36 for any of the characters entering the register 34 which are in the block being transmitted in code, except for the last such character, as set forth above in the encoding algorithm.

For use in updating the code table contained in memory 32, encoding section 10 also includes a write address register set 42 and a register string 43 comprising six registers 43a–43f. The register set 42 contains the column address of the next available location in memory 32 for each of the characters $C_0$ to $C_{127}$. Accordingly, it has 128 registers, $42_0$ to $42_{127}$, corresponding to the respective characters, these registers each containing the next available location in one of the rows in memory 32.

The registers 43a–43f receive, in sequence, the characters shifted out of the register 24, the characters being shifted through the string 43 by the S pulses. Thus, the string 43 contains the last six characters transmitted from the encoding section (by plaintext or in code). In addition each of the registers 43a–43f contains a status bit associated with the character contained therein. The function of this bit is explained below.

Each time that a decision is made as to whether a plaintext character or a code is to be transmitted, the encoding section 10 also makes a decision as to whether or not the code table in memory 32 is to be updated. Specifically, in the example described herein, the code table is updated with a new block of five characters if either (a) a plaintext character is to be transmitted or (b) a code for a block of only two characters is to be transmitted.

However, as explained above, the updating is delayed until the next five characters have been processed through the encoding section. The decoding section at the receiving location updates its code table with plaintext, i.e. decoded characters. The delay ensures that the receiving location updates its code table in synchronism with the updating at the transmitting location, with respect to the sequence of characters in the message. In other words, it ensures that the transmitting and receiving locations have exactly the same code table at any given point in the character sequence.

The comparison circuit 36 emits an update pulse in response to the $T_2$ pulse from controller 22 when the comparison operation indicates either no match or a match of fewer than three characters. The update pulse sets a flip-flop 45. The output of the flip-flop in turn sets the status bit in register 43f in response to the next S pulse, which also shifts the character in register 24 into register 43f. The same S pulse resets the flip-flop 45.

Succeeding S pulses shift the characters in registers 25–28 into the register string 43 so that, after a total of five such pulses, the block of characters that were contained in the registers 24–28 at the time of the update pulse are now contained in registers 43b–43f. Also, at this time, the register 43a contains the character that provided the row address for code memory 32 at the time of the update pulse. Moreover, the status bit that was set in register 43f is now contained in register 43b. This set status bit in register 43b enables a gate 47 to pass a $T_1$ pulse as a deferred update pulse to controller 22.

The controller responds with an update routine which is completed before the next encoding routine. Specifically, it conditions the R/W signal for a WRITE operation in code memory 32. The R/W signal also causes the multiplexer 35 to select the register 43a for a row address for the memory 32 and it causes the multiplexer 33 to connect the register set 42 to memory 32 for a column address. Also, the character in register 43a selects the corresponding one of the registers $42_0$–$42_{127}$ to provide the latter address. A suitable signal from the controller 22 then causes the memory 32 to load into the selected location, the block contained in the registers 43b–43f and it increments the column address in the selected register $42_0$–$42_{127}$ by one to provide the next available location in the selected row. This completes the update routine.

Incrementing of the registers $42_0$–$42_{127}$ when they are used to address the memory 32 causes the storage of new blocks in each memory row to cycle through the locations in that row. Accordingly, each time a block of characters is stored in a memory row, it replaces the oldest block in that row. This makes the code table contained in the memory 32 follow, in general, changes in the frequencies of occurrence of various blocks in the character stream processed by the system.

Figure 2:
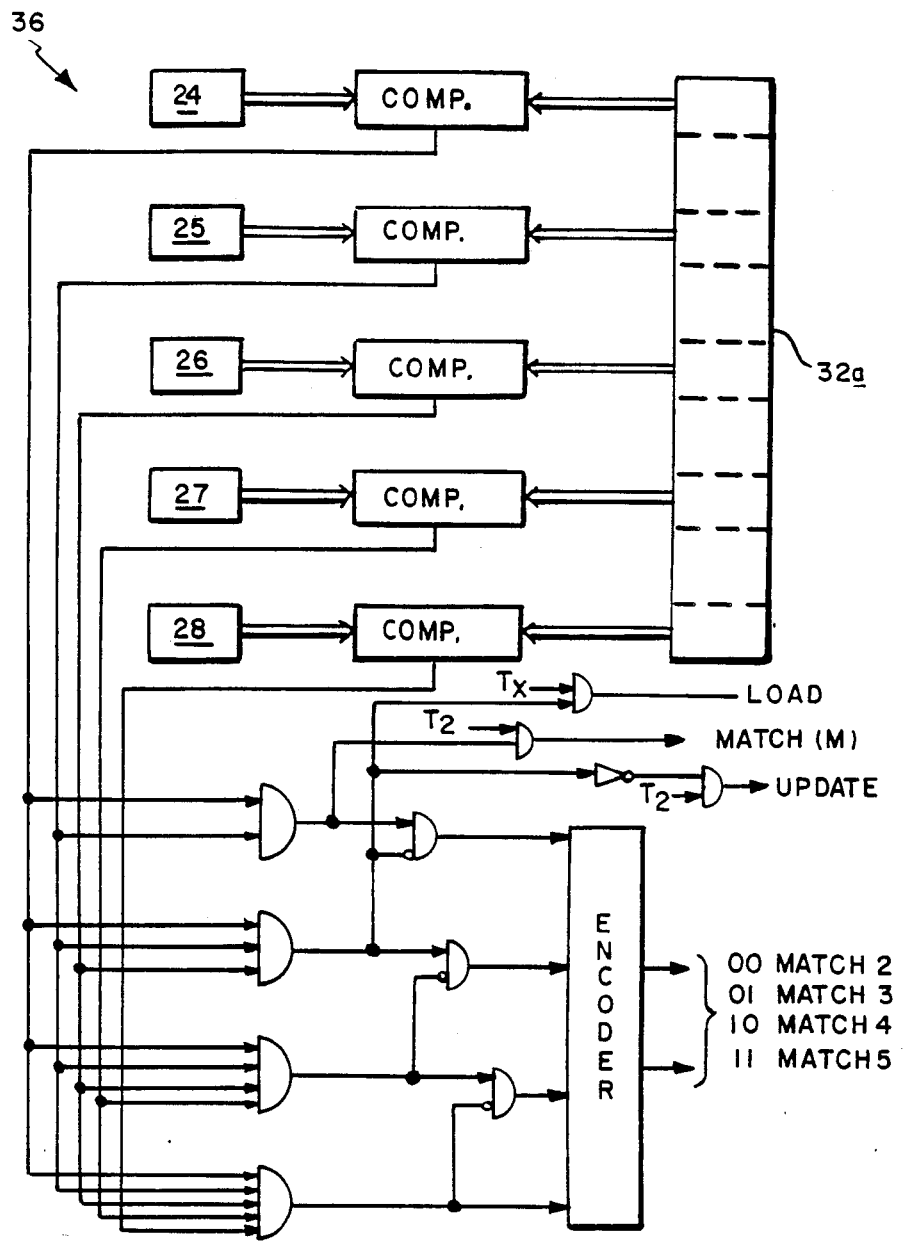
FIG. 2 is a block diagram showing a portion of the FIG. 1 section in greater detail.

FIG. 2 shows in greater detail the comparison circuit 36 which compares the contents of registers 24 to 28 with a block of characters retrieved from a selected code memory location 32a and develops the various output signals described above.

Figure 3:
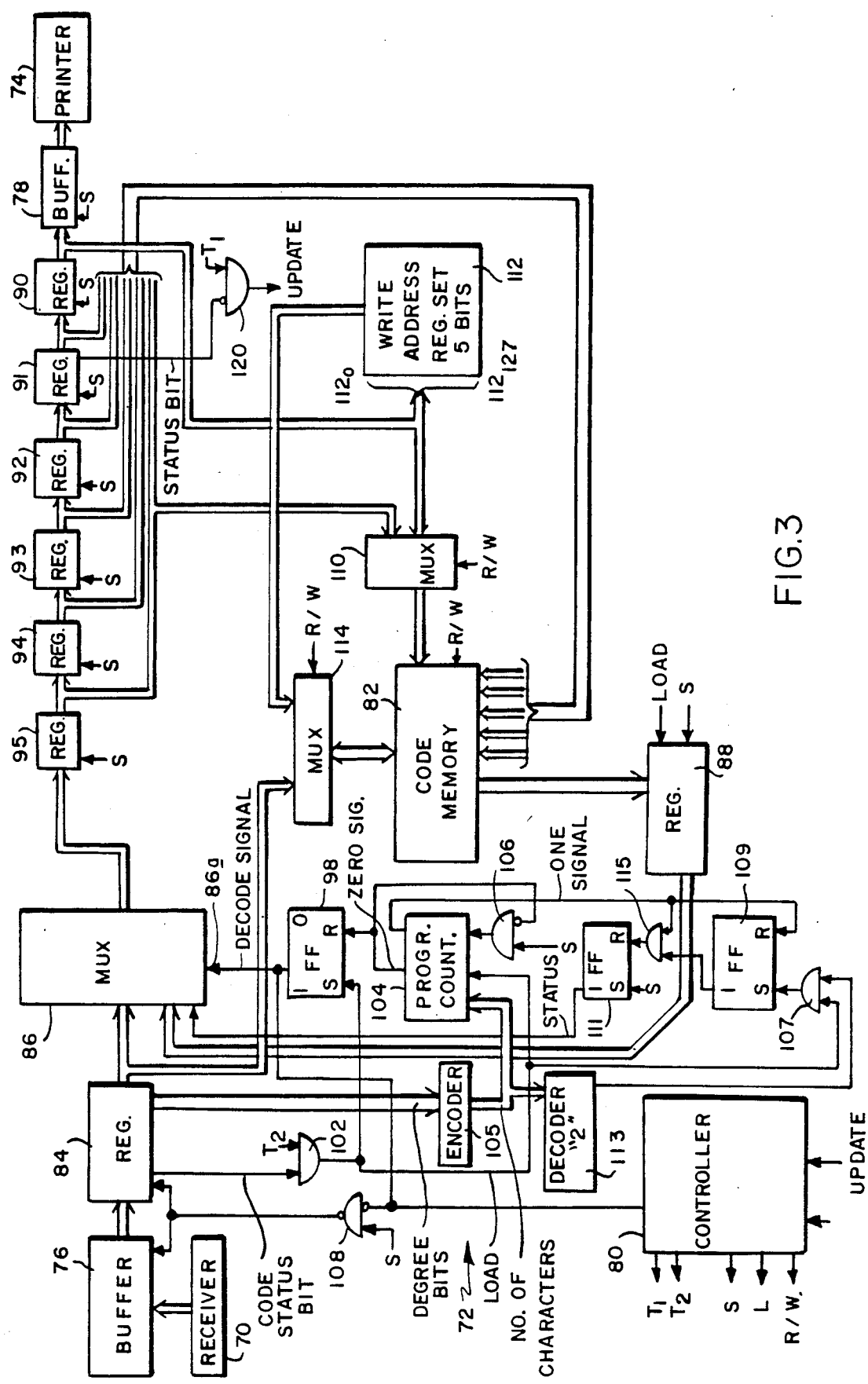
FIG. 3 is a view similar to FIG. 1 of the receiving section of the system.

Referring now to FIG. 3, the encoded transmission from section 10 arrives at a receiver 70 and is then processed by a decoding section indicated generally at 72 to recover the plaintext data in the original message and route it to an output device such as a printer 74. Section 72 is isolated from the receiver and printer by buffers 76 and 78 and operates independently in response to an internal controller 80.

The successive data words in the incoming transmission, consisting of plaintext and coded character blocks, are shifted from buffer 76 into a register 84 where they are applied to one terminal or channel of a two-channel multiplexer 86.

When a decode signal is asserted at its control terminal 86a, the multiplexer passes a character contained in a register 88; otherwise, the multiplexer passes a plaintext character contained in the register 84. The contents of the register 88 are blocks of characters obtained from a code table in a random-access code memory 82. The output of the multiplexer 86 is thus a sequence of plaintext characters, which are shifted through a series of six registers 95 to 90 to buffer 78 by S pulses from a controller 80.

The decode signal is generated by a flip-flop 98. The flip-flop 98 is set by a timing $T_2$ pulse from controller 80 passed by a gate 102. The gate 102 is enabled by the ONE status bits appended to code words at the encoding station as described above. Thus, when the word loaded into register 84 includes a column number, the gate 102 passes the $T_2$ pulse to set the flip-flop 98 to its decode state. On the other hand, if a plaintext character is loaded into register 84 from the buffer 76, the status bit will be a ZERO and the flip-flop 78 will not be set. With the decode signal unasserted, the multiplexer 86 will pass the character to the register 95 where it will be loaded in response to the next S pulse from controller 80.

The decode signal from flip-flop 98 is also applied to controller 80 to signal the controller to initiate a decode routine; and it is applied to an AND gate 108 to prevent S pulses from being passed to buffer 76 and register 84. The aforesaid pulse from gate 102 is also routed to a counter 104 to load the counter with the degree number from an encoder 105, which translates the degree bits in the code word contained in register 84 into the number of plaintext characters in the encoded block, i.e. the block whose column number is in the code word.

The pulse from counter 102 is also applied to a gate 107, which is enabled by the output of a decoder 113 when the number of characters in the encoded block is two. The pulse passed by the gate 107 sets a flip-flop 109 whose function is described below.

As does counter 52 described above, counter 104 counts down from five, four, three or two depending upon the character number from the encoder 105. Counter 104 counts S pulses passed by a gate 106 and when its count reaches zero, a decoding circuit in the counter emits a ZERO signal to the RESET input of flip-flop 98. That signal also disables gate 106, thereby stopping the count so that counter 104 "idles" in its zero state.

Row addresses for code memory 82 are applied to the memory by way of a multiplexer 110 from either register 95 or register 90, depending upon whether section 72 is undergoing a decode routine or an update routine as will be described shortly. Column numbers for the memory 82 are obtained either from register 84 or a write register set 112, also depending upon whether the section is following its decode or update routine. The column numbers are applied to the memory by way of a multiplexer 114.

In response to the decode signal, the controller 80 initiates a decode routine before the next S pulse by conditioning a READ/WRITE (R/W) signal to the read state. This conditions the memory 82 for a read operation. It also conditions the multiplexers 110 and 114 to pass the character in register 95 as a row address for memory 82 and the column number in register 84 as a column address. Thereupon, controller 80 initiates a READ cycle in the memory and applies a LOAD (L) pulse to register 88 to load the block of five characters from the addressed memory location into register 88.

The SHIFT pulses S from controller 80 then shift characters one-by-one from register 88 through the multiplexer 86 into the following series of registers 95-90 until counter 104 counts to zero and issues a ZERO signal. That signal resets flip-flop 98, thereby terminating the decode signal, so that any remaining characters in register 88 are not passed by the multiplexer 86. The termination of the decode signal also enables AND gate 108 so that the next S pulse is transmitted to the buffer 76 and register 84. This loads the register 84 with the next word in the received message.

To give an example, if the two degree bits in the code word in register 84 indicate a three match, i.e. the first three of the five characters of the block stored in the memory location addressed by the code word and the preceding plaintext character are to be used to recover plaintext from the transmission, a three count is loaded into counter 104. Resultantly, three of the block of five characters loaded into register 88 from memory 82 are shifted through multiplexer 86 by the next three S pulses and no new data is loaded into register 84 during that time. At the end of that decode routine then, the row-addressing character that was in register 95 is now in register 92 and the three characters retrieved from memory 82 are contained in registers 93 to 95.

If the next word shifted into register 84 is a code word, the aforesaid decode routine is repeated. If it is a plaintext character, the character is shifted through the multiplexer 86 to register 95, with the characters in registers 92 to 95 advancing along the series of registers toward buffer 78.

The status bit, with some modification, is also passed through the multiplexer 86 and passed by the succeeding registers 95-91 to the register 90. Specifically, the ZERO status bits appended to incoming plaintext characters are passed unchanged by the multiplexer 86. When decoded characters are being retrieved from the register 88, the status bit is supplied by a flip-flop 111. This flip-flop is normally set. It is reset by the output of a gate 115 that passes a signal from the counter 104 indicating a count of ONE. The gate 115, in turn, is enabled by the set state of the flip-flop 109, i.e. when the number of characters in the encoded block is two.

The flip-flop 109 is reset by the count-of-ONE signal from counter 104 and the flip-flop 111 is set by the next S pulse. Thus, the last character in each decoded block of two is tagged with a ZERO status bit, the other characters in the block being tagged with ONE status bits, as are all characters in decoded blocks of three, four or five characters.

Accordingly, the status bit appended to each character passed by the multiplexer 86 has a ZERO value if, and only if, the character was received in plaintext or the character is the last character in a decoded block of two characters. This is the same condition used in the encoding section 10, as described above, to determine whether or not to update the code table at the transmitting location.

Still referring to FIG. 3, we shall now describe the mechanism by which the decoding section 72 updates its code table in memory 82 so that the table corresponds exactly to the updated table stored in memory 32 of the encoding section 10.

In the register 91, the status bit is used as an indication of whether or not to initiate an update routine each time a character is shifted into that register. If that bit is a ZERO, it enables a gate 120 to pass a timing pulse $T_1$ from the controller 80.

The controller responds to the resulting update pulse by running the update routine. Specifically, it conditions the R/W signal for a write operation in the memory 82. This state of the R/W signal also conditions multiplexer 110 to pass the character contained in the register 90 as a row address for the memory 82 and it conditions multiplexer 114 to pass the output of a write address register set 112 as the column address. In response to a suitable signal from controller 80, the memory then loads into its addressed location the five characters contained in registers 91–95.

The register set 112 is identical to the register set 42 in the encoding section. Thus it has a set of registers $112_0$–$112_{127}$, each containing the "next available" column address in one of the rows in the code memory 82. The registers are selected by the character $C_0$–$C_{127}$ contained in the register 90. Moreover, the column numbers in the registers $112_0$–$112_{127}$ are updated in the same manner as the column numbers in the register set 42.

Accordingly, the code table in memory 82 is updated according to the same algorithm that governs updating of the code table in the memory 32 in the encoding section. The system therefore adapts its code to the plaintext data processed by it, yet it does not have to transmit code changes to the receiving location.

The terms "row" and "column" are used herein in a conceptual sense to refer to two parts of a composite memory address which is, in the usual case, a concatenation of these two parts. Thus the physical rows and columns in the memories 32 and 82 will ordinarily not correspond with the rows and columns referred to herein.

The degree bits may also be thought of as part of the memory address, since they are also used in designating specific physical locations in the code memories. This will be apparent when one considers one of the numerous variations that can be made in the addressing scheme without departing from the encoding concept disclosed herein. Specifically, instead of storing a block of characters in a single memory location, one might store the characters in the block in successive locations. Thus, if blocks of four characters are considered, the four memory locations used to store the characters in each block would be designated by the two lowest order bits in the word used to address the memory. The addressing word would then comprise (a) the row address as determined above, (b) the column number, as defined above, which identifies the location of a particular block in the memory and (c) the lower order bits specifying a location in that block. The code transmitted to identify a block of characters would, however, be the same as described above.

The efficiency of a code depends in part on the numbers of different sequences that are encoded. It also depends, inversely, on the number of bits in the code word for each encoded sequence. In a sense, the code word for each of the encoded blocks of characters stored in the memories 32 and 82 includes the entire address of the memory location of the encoded block. That is, it consists of a concatenation of the row and column addresses and the degree bits. However, the row address is already transmitted, in code or in plaintext, as part of the preceding text. Therefore, the transmitted code word consists only of the column number and degree bits and the system effectively uses short code words to identify a relatively large number of encoded blocks.

In another variation of the invention, I make use of this feature of the invention by expanding the memory through the use of additional row addresses, thereby increasing the number of encoded sequences without increasing the number of bits in the transmitted code word. Specifically, I use sequences, e.g. pairs, of characters to designate memory rows.

If this is done in a straightforward manner, it will square the number of memory addresses if pairs of characters are used. It will not, however, increase efficiency to a corresponding degree since some pairs of characters, e.g. ii, qx, zw, are never or very rarely occur. Accordingly, little is to be gained by providing memory locations specifically for these pairs. I prefer therefore to use identical look-up tables which translate character pairs into row addresses for the code memories 32 and 82. The tables can be arranged to generate different row addresses for the more common character pairs and single row addresses for groups of the less common pairs.

It will thus be seen that the objects set forth above, among those made apparent from the preceding description, are efficiently attained, and, since certain changes may be made in the above method and in the above construction without departing from the scope of the invention, it is intended that all matter contained in the above description or shown in the accompanying drawings be interpreted as illustrative and not in a limiting sense.

It is also to be understood that the following claims are intended to cover all of the generic and specific features of the invention herein described.

What is claimed as new and desired to be secured by Letters Patent of the U.S. is:

1. The method of compressing a digital data stream composed of plaintext symbols comprising the steps of
  A. maintaining a code table of plaintext symbols at a transmitting location;
  B. encoding blocks of plaintext symbols in the stream using said code table to produce codes for said blocks;
  C. updating said code table according to an update algorithm;
  D. transmitting the codes for said blocks plus only plaintext symbols in blocks not previously encoded to a receiving location;
  E. maintaining a code table at the receiving location;
  F. decoding the transmitted codes for said blocks using the code table at the receiving location to recover plaintext symbols in the data stream; and G. updating the receiving location code table by applying to the plaintext symbols received from the transmitting location the same update algorithm used at the transmitting location so that the two code tables remain identical whereby the coded symbol blocks in the transmission can be decoded continuously at the receiving location without requiring the separate transmission of codes for said not previously encoded blocks to update the receiving location code table.

2. The method defined in claim 1 and including the additional step of updating the code tables in accordance with the frequencies of occurrence of the various plaintext symbol blocks in the data stream.

3. The method defined in claim 1 wherein the maintaining of each code table is accomplished by storing said plaintext symbol blocks in a memory whose memory locations are defined by said codes and plaintext symbols representing the data stream.

4. The method defined in claim 3 wherein the transmitting step is controlled so that
   A. if a plaintext symbol in the data stream is transmitted, the next block of plaintext symbols in the data stream is transmitted in code if that block is found in a memory location whose address comprises that plaintext symbol; otherwise the next plaintext symbol in the data stream is transmitted;
   B. if a plaintext symbol in the data stream is at the end of a block of plaintext symbols transmitted in code, the next block is transmitted in code if it is found in a memory location adressed by that plaintext symbol; otherwise the next plaintext symbol in the data stream is transmitted; and
   C. if a plaintext symbol in the data stream is in a block transmitted in code but it is not at the end of that block, nothing is transmitted.

5. The method defined in claim 1 and including the additional step of preloading both code tables with identical plaintext symbols prior to commencement of the transmission.

6. A system for compressing a digital data stream composed of plaintext symbols comprising
   A. means defining a code table of plaintext symbols at a transmitting location;
   B. means for encoding blocks of plaintext symbols in the stream using said code table to produce codes for said blocks;
   C. means for updating said table according to an update algorithm;
   D. means for transmitting the codes for said blocks plus only plaintext symbols in blocks not previously encoded to a receiving location;
   E. means defining a code table at the receiving location;
   F. means for decoding the transmitted codes for said blocks using the code table at the receiving location to recover plaintext symbols in the data stream; and
   G. means for updating the receiving location code table by applying to the plaintext symbols received from the transmitting location the same update algorithm used at the transmitting location so that the two code tables remain identical whereby the coded symbol blocks in the transmission can be decoded continuously at the receiving location without requiring the separate transmission of codes for said not previously encoded blocks to update the receiving location code table.

7. The system defined in claim 6 and further including means for controlling the updating means so that the code tables contain the more commonly occurring blocks of plaintext symbols in the data stream.

8. The system defined in claim 6 wherein both said code tables have identical plaintext symbol contents prior to the beginning of the transmission.

9. The system defined in claim 6 wherein each code table defining means comprise a memory addressed by codes and plaintext symbols representing the data stream.

10. The system defined in claim 9 wherein the transmitting means transmit said codes in accordance with the following algorithm:
    A. if the plaintext symbol in the data stream is transmitted, the next block of plaintext symbols in the data stream is transmitted in code if that block is found in a memory location whose address comprises that plaintext symbol; otherwise the next plaintext symbol in the data stream is transmitted;
    B. if a plaintext symbol in the data stream is at the end of a block of plaintext symbols transmitted in code, the next block is transmitted in code if it is found in a memory location addressed by that plaintext symbol; otherwise the next plaintext symbol in the data stream is transmitted; and
    C. if a plaintext symbol in the data stream is in a block of plaintext symbols transmitted in code but it is not at the end of a block, nothing is transmitted.

* * * * *